(12) United States Patent
Kim et al.

(10) Patent No.: US 8,691,703 B2
(45) Date of Patent: Apr. 8, 2014

(54) METHOD OF MANUFACTURING SEMICONDUCTOR DEVICE

(75) Inventors: Suk Ki Kim, Yongin-si (KR); Hyeon Soo Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/585,166

(22) Filed: Aug. 14, 2012

(65) Prior Publication Data
US 2013/0084696 A1    Apr. 4, 2013

(30) Foreign Application Priority Data
Oct. 4, 2011    (KR) .................. 10-2011-0100710

(51) Int. Cl.
*H01L 21/302*    (2006.01)

(52) U.S. Cl.
USPC ...... 438/734; 438/721; 438/749; 257/E21.24; 257/E21.438; 257/E21.622

(58) Field of Classification Search
None
See application file for complete search history.

(56) References Cited

U.S. PATENT DOCUMENTS

| | | | |
|---|---|---|---|
| 7,800,157 B2 * | 9/2010 | Ryusenji et al. | 257/315 |
| 2008/0246075 A1 * | 10/2008 | Matsuno | 257/316 |
| 2012/0070976 A1 * | 3/2012 | Kim et al. | 438/594 |

* cited by examiner

*Primary Examiner* — Julio J Maldonado
*Assistant Examiner* — Joseph Galvin, III
(74) *Attorney, Agent, or Firm* — William Park & Associates Patent Ltd.

(57) ABSTRACT

A semiconductor device is manufactured by, inter alia: forming second gate lines, arranged at wider intervals than each of first gate lines and first gate lines, over a semiconductor substrate; forming a multi-layered insulating layer over the entire surface of the semiconductor substrate including the first and the second gate lines; etching the multi-layered insulating layer so that a part of the multi-layered insulating layer remains between the first gate lines and the first and the second gate lines; forming mask patterns formed on the respective remaining multi-layered insulating layers and each formed to cover the multi-layered insulating layer between the second gate lines; and etching the multi-layered insulating layers remaining between the first gate lines and between the first and the second gate lines and not covered by the mask patterns so that the first and the second gate lines are exposed.

14 Claims, 9 Drawing Sheets

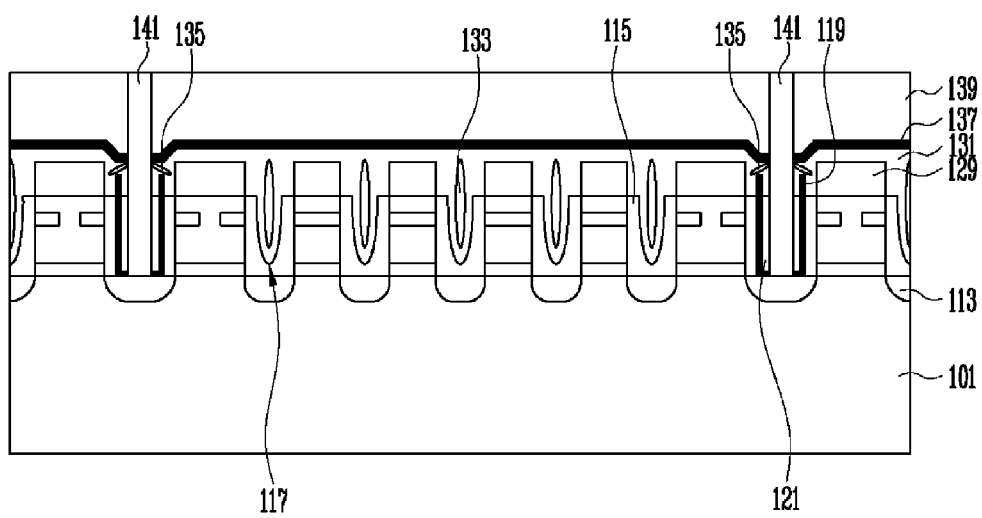

METHOD OF MANUFACTURING SEMICONDUCTOR DEVICE

CROSS-REFERENCE TO RELATED APPLICATION

The present application claims priority under 35 U.S.C. 119(a) to Korean patent application number 10-2011-0100710 filed on Oct. 4, 2011, in the Korean Intellectual Property Office, the entire disclosure of which is incorporated by reference herein.

BACKGROUND

1. Field of the Invention

Example embodiments relate to a method of manufacturing a semiconductor device and, more particularly, to a method of manufacturing a semiconductor device including gate lines.

2. Description of the Related Art

A semiconductor device typically includes numerous transistors. In particular, a semiconductor memory device includes numerous transistors arranged densely and regularly. For example, flash memory includes numerous strings that are arranged regularly. Each of the strings includes a plurality of cell transistors coupled in series between source and drain select transistors. A gate line coupled to the gates of cell transistors is a word line, a gate line coupled to the gates of source select transistors is a source select line, and a gate line coupled to the gates of drain select transistors is a drain select line. In general, an interval between adjacent drain select lines and an interval between adjacent source select lines is wider than an interval between adjacent word lines.

To increase the degree of integration of devices, the width of gate lines are gradually narrowed, thereby increasing the resistance of a gate line. In order to improve the resistance of a gate line, a method of forming the gate lines using a metal silicide layer is used. A silicidation process of forming the metal silicide layer includes etching a multi-layered insulating layer.

BRIEF SUMMARY

Example embodiments relate to a method of manufacturing a semiconductor device, the method generally directed to etching a multi-layered insulating layer.

A method of manufacturing a semiconductor device according to an aspect of the present disclosure includes forming first gate lines and second gate lines over a semiconductor, wherein the second gate lines are arranged at wider intervals than each of first gate lines; forming a multi-layered insulating layer over the entire surface of the semiconductor substrate including the first and the second gate lines; etching the multi-layered insulating layer so that a part of the multi-layered insulating layer remains between the first gate lines and between the first and the second gate lines; forming a mask pattern on the remaining multi-layered insulating layer, wherein the mask pattern covers the multi-layered insulating layer between the second gate lines; and etching the multi-layered insulating layers remaining between the first gate lines and between the first and the second gate lines and not covered by the mask patterns so that the first and the second gate lines are exposed.

A method of manufacturing a semiconductor device according to another aspect of the present disclosure includes forming stack structure, including a silicon layer, over a semiconductor substrate; forming word lines and select lines, arranged at wider intervals than the word lines, by patterning the stack structure; forming a first insulating layer, covering the word lines and the select lines, so that air gaps are formed between the word lines and between the word line and the select line, and the semiconductor substrate between the select lines is exposed; sequentially forming an etch-stop layer and a second insulating layer over the entire surface of the semiconductor substrate including the first insulating layer; removing a part of each of the second insulating layer, the etch-stop layer, and the first insulating layer so that the air gaps are exposed; forming a sacrificial layer on the entire surface of the semiconductor substrate, including the air gaps, so that voids are formed within the air gaps; covering the sacrificial layer between the select lines using mask pattern; etching a part of each of the sacrificial layer and the first insulating layer not covered by the mask pattern so that parts of the silicon layer are exposed; removing the mask pattern; and forming the exposed parts of the silicon layer into metal silicide layer by a silicidation process.

BRIEF DESCRIPTION OF THE DRAWINGS

FIGS. 1A to 1I are cross-sectional views illustrating a method of manufacturing a semiconductor device according to an embodiment of this disclosure.

DESCRIPTION OF EMBODIMENTS

Hereinafter, some example embodiments of the present disclosure will be described in detail with reference to the accompanying drawings. The figures are provided to allow those having ordinary skill in the art to understand a scope of the embodiments of the disclosure.

FIGS. 1A to 1I are cross-sectional views illustrating a method of manufacturing a semiconductor device according to an embodiment of this disclosure.

Figure 1A:
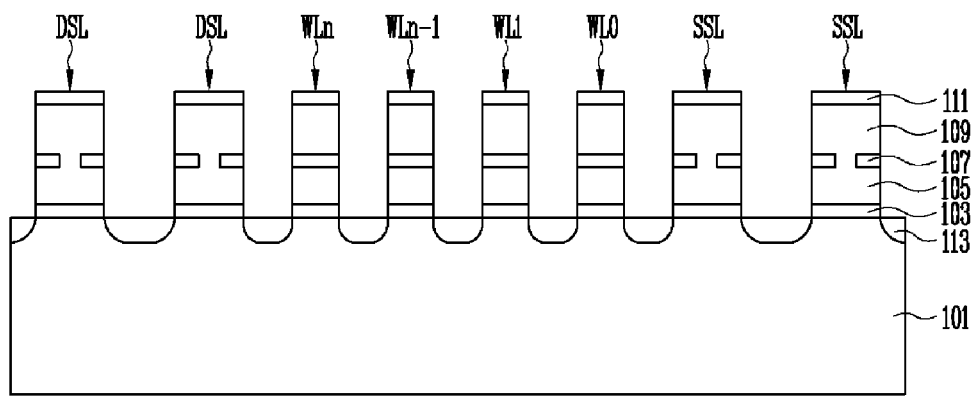

Referring to FIG. 1A, gate lines SSL, WL0 to WLn, and DSL having second silicon layers 109 as highest layers are formed over a semiconductor substrate 101. This is described in detail below.

Gate lines of NAND flash memory may include first gate lines and second gate lines. The first gate lines are the word lines WL0 to WLn. The second gate lines are the drain select lines DSL or the source select lines SSL. The gate lines are formed in a cell region. Third gate lines (not shown) of a high voltage transistor and a low voltage transistor are formed in a peripheral circuit region. The following processes may be performed in order to form the gate lines.

First, a well (not shown) is formed within the semiconductor substrate 101, and a stack structure for gates is formed over the semiconductor substrate 101. The stack structure includes a tunnel dielectric layer 103, a first silicon layer 105, a dielectric layer 107, and the second silicon layer 109 which are sequentially stacked. In order to form the stack structure, the tunnel dielectric layer 103 is formed on the entire surface of the semiconductor substrate 101. A gate insulating layer for the high voltage transistor or the low voltage transistor is formed in the peripheral circuit region. The first silicon layer 105 is formed on the tunnel dielectric layer 103. The first silicon layer 105 may be a single undoped polysilicon layer or a single doped polysilicon layer, or the first silicon layer 105 may have a stack structure of an undoped polysilicon layer and a doped polysilicon layer. 3-valance impurities or 5-valance impurities may be added to the doped polysilicon layer.

The first silicon layer 105 is etched by an etch process using an isolation mask for defining isolation regions as an etch mask. Thus, the first silicon layer 105 is patterned into a plurality of parallel silicon lines. Trenches (not shown) having parallel line forms are formed in the isolation regions by etching the tunnel dielectric layer 103 and the semiconductor substrate 101. The trenches are filled with an insulating layer. The insulating layer on the isolation mask is removed so that the insulating layer remains only within the trenches and on the trenches. Accordingly, isolation layers (not shown) are formed.

After removing the isolation mask, the dielectric layer 107 is formed on the entire surface of the semiconductor substrate 101. The dielectric layer 107 has a stack structure of an oxide layer, a nitride layer, and an oxide layer. In some embodiments, the oxide layer or the nitride layer may be replaced with an insulating layer having a higher dielectric constant than the oxide layer or the nitride layer. A part of the dielectric layer 107 corresponding to regions where the drain select lines DSL and the source select lines SSL will be formed is etched. Accordingly, a part of the first silicon layer 105 corresponding to the regions where the drain select lines DSL and the source select lines SSL will be formed is exposed.

The second silicon layer 109 is formed on the dielectric layer 107. The second silicon layer 109 may be formed of a doped polysilicon layer. Accordingly, the stack structure for gates is formed.

A hard mask layer 111 is formed over the stack structure. The hard mask layer 111, the second silicon layers 109, and the dielectric layers 107 are patterned in a direction to cross the silicon lines formed by patterning the first silicon layer 105. Thus, a plurality of parallel control gates is formed. Next, the first silicon layer 105 is etched. Accordingly, the plurality of gate lines SSL, WL0 to WLn, and DSL are formed over the semiconductor substrate 101. The hard mask layer 111 may be missing from some of the gate lines because the hard mask layer 111 may be removed in a subsequent process. Accordingly, the second silicon layers 109 may become the highest layers of the gate lines SSL, WL0 to WLn, and DSL.

Since the second silicon layer 109 is formed in a state in which a part of the dielectric layer 107 has been etched, the first silicon layer 105 and the second silicon layer 109 of the drain select lines DSL or the source select lines SSL are coupled through the etched part of the dielectric layer 107.

Junctions 113 are formed in the semiconductor substrate 101 between the gate lines SSL, WL0 to WLn, and DSL through an ion implantation process. The junctions 113 may be formed by implanting 5-valance impurities.

Each of the drain and source select lines DSL and SSL has a greater width than each of the word lines WL0 to WLn. An interval, that is, a space between the drain select lines DSL and the interval between the source select lines SSL is greater than an interval between the word lines WL0 to WLn.

Figure 1B:
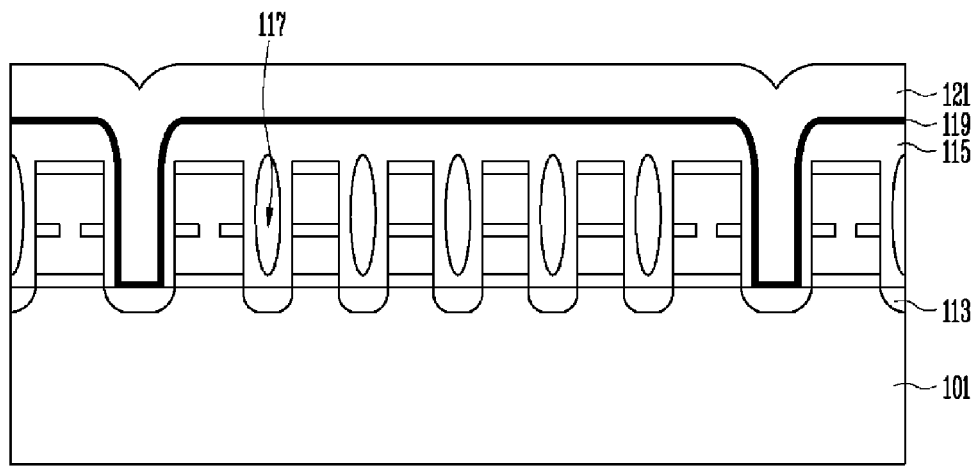

Referring to FIG. 1B, a multi-layered insulating layer 115, 119, and 121 on the entire structure including the gate lines SSL, WL0 to WLn, and DSL. This is described in detail below.

A first insulating layer for spacers is formed on the entire surface of the semiconductor substrate 101 including the gate lines SSL, WL0 to WLn, and DSL. Herein, forming a layer on the entire surface of a semiconductor substrate, for example, semiconductor substrate 101, may mean forming a layer on all of an upper surface of a semiconductor substrate including upper surfaces of elements formed on the semiconductor substrate. An interval between the source select line SSL and the word line WL0, and an interval between the drain select line DSL and the word line WLn, and an interval between the word lines WL0 to WLn is smaller than the interval between the drain select lines DSL and the interval between the source select lines SSL. Furthermore, in the process of forming the first insulating layer, overhangs are formed at the top corners of the gate lines DSL, SSL, and WL0 to WLn. Accordingly, the first insulating layer is not fully filled between the source select line SSL and the word line WL0, between the drain select line DSL and the word line WLn and between the word lines WL0 to WLn, but air gaps 117 are formed therebetween. Furthermore, since the drain select lines DSL are spaced apart from each other at a relatively wide interval and the source select lines SSL are spaced apart from each other at a relatively wide interval, the first insulating layer is formed along steps resulting from the drain and source select lines DSL and SSL between the drain select lines DSL and between the source select lines SSL.

The insulating layer spacer 115 is formed by performing an etch-back process (that is, an anisotropic etch process). The junctions 113 between the drain select lines DSL and between the source select lines SSL are exposed through the insulating layer spacer 115, and the insulating layer spacer 115 remains on the sidewalls of the drain and source select lines DSL and SSL. Furthermore, the insulating layer spacer 115 forms the air gaps 117 between the source select line SSL and the word line WL0, between the drain select line DSL and the word line WLn, and between the word lines WL0 to WLn. The insulating layer spacer 115 covers the junctions 113 between the source select line SSL and the word line WL0, between the drain select line DSL and the word line WLn, and between the word lines WL0 to WLn. And the insulating layer spacer 115 covers the drain and source select lines DSL and SSL, and the word lines WL0 to WLn.

The first insulating layer may be formed of an oxide layer.

A first etch-stop layer 119 is formed on the entire surface of the semiconductor substrate 101 including the insulating layer spacer 115. A second insulating layer 121 for an interlayer dielectric layer is formed on the first etch-stop layer 119.

The first etch-stop layer 119 may be formed of a nitride layer. The first etch-stop layer 119 is formed on the entire surface of the semiconductor substrate 101 to a thickness enough to maintain the steps resulting from the gate lines DSL, SSL, and WL0 to WLn. The second insulating layer 121 may be formed of an oxide layer. The second insulating layer 121 is formed on the entire surface in which the first etch-stop layer 119 is formed, the second insulating layer 121 may be formed to a thickness enough to fill the space between the drain select lines DSL and the space between the source select lines SSL.

Figure 1C:
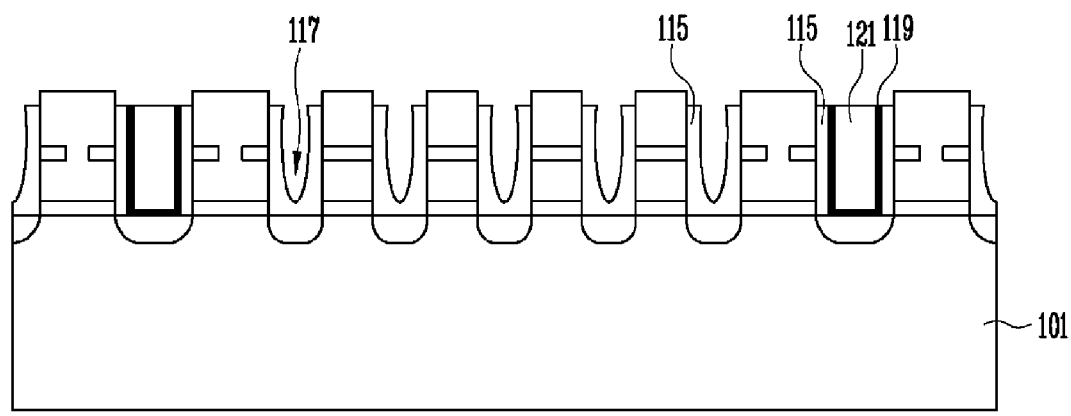

Referring to FIG. 1C, the second insulating layer 121, the first etch-stop layer 119, and the insulating layer spacer 115 are partially removed so that the air gaps 117 are opened. Thus, the second insulating layer 121 and the first etch-stop layer 119 remain only between the drain select lines DSL and between the source select lines SSL. And only the insulating layer spacer 115 remains between the gate lines SSL, WL0 to WLn, and DSL. Furthermore, the hard mask layer 111 (see, for example, FIG. 1B) may be removed. This is described in detail below.

Part of the second insulating layer 121 is removed by a polishing process which is stopped when the first etch-stop layer 119 is exposed. The polishing process may be performed a chemical mechanical polishing (CMP) process. Next, the first etch-stop layer 119, the insulating layer spacer 115, and the second insulating layer 121 are partially removed using a first anisotropic etch-back process. During the first etch-back process, the etch thickness is controlled so that the insulating layer spacer 115 remains over the air gaps 117 to a specific thickness and thus the air gaps 117 are not exposed. Next, the first etch-stop layer 119, the insulating layer spacer 115, the second insulating layer 121, and the hard mask layers 111 (see, for example, FIG. 1B) are etched by a second etch-back process so that the air gaps 117 are exposed. The second etch-back process is performed using a different etch material than the first etch-back process.

The etch material used in the second etch-back process generates reactive by-products removed by a cleaning process that may be performed right after a unit process, where during the cleaning process a reaction with the insulating layer spacer 115 formed of an oxide layer may occur. During the second etch-back process, the reactive by-products are formed on the exposed surfaces of the air gaps 117. Accordingly, during the second etch-back process, damage to the semiconductor substrate 101 can be prevented because the insulating layer spacer 115 at the bottoms of the air gaps 117 are protected by the reactive by-products. The reactive by-products are removed after the second etch-back process. Accordingly, the air gaps 117 are opened.

Figure 1D:
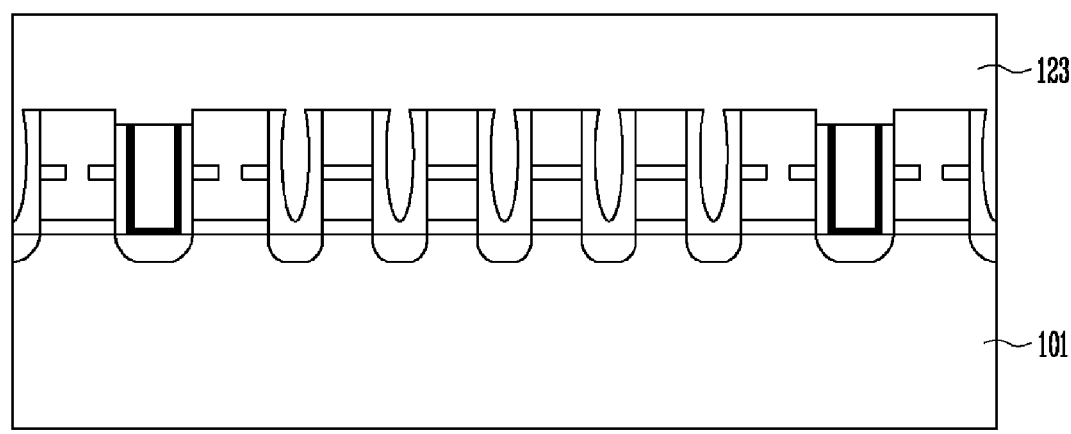

Referring to FIG. 1D, a gap-fill layer 123 is formed on the entire surface of the semiconductor substrate 101 including the gate lines SSL, WL0 to WLn, and DSL so that the spaces between the gate lines SSL, WL0 to WLn, and DSL are filled.

Figure 1E:
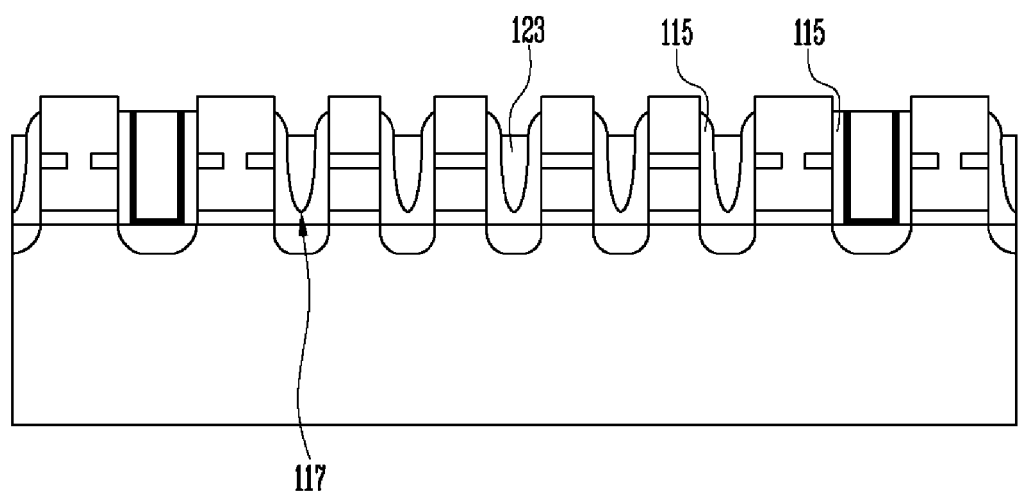

Referring to FIG. 1E, in order to expose the openings of the air gaps 117, the gap-fill layer 123 is etched by an anisotropic etch process, such as etch-back. Next, the insulating layer spacers 115 exposed by etching the gap-fill layer 123 are etched. Accordingly, the width of the opening of each of the air gaps 117 may be widened.

Figure 1F:
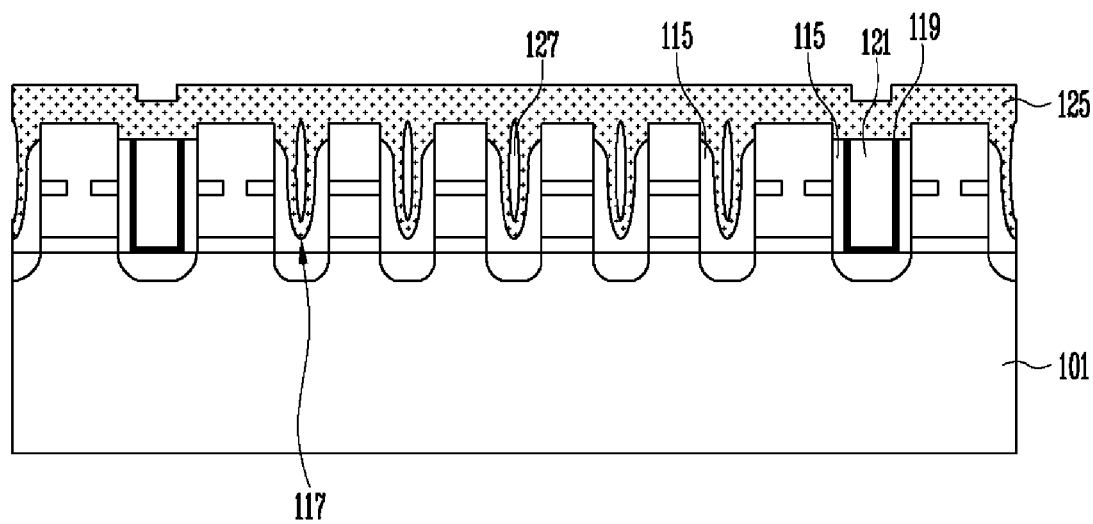

Referring to FIG. 1F, after removing the gap-fill layer 123 (see, for example, FIG. 1E), a sacrificial layer 125 is formed on the entire surface of the semiconductor substrate 101 including the air gaps 117 having the widened openings. Since the openings of the air gaps 117 have been widened through the previous process, the sacrificial layer 125 may be formed over the insulating layer spacers 115 formed under the air gaps 117. Furthermore, the width of each of the air gaps 117 is smaller than the interval between the drain select lines DSL or between the source select lines SSL, and overhangs of the insulating layer are formed at the top corners of the gate lines DSL, SSL, and WL0 to WLn in the process of forming the sacrificial layer 125. Thus, the air gaps 117 are not fully filled by the sacrificial layer 125. Accordingly, the sacrificial layer 125 is not fully filled between the select line SSL and the word line WL0, between the drain select line DSL and the word line WLn and between the word lines WL0 to WLn, but voids 127 are formed therebetween.

Furthermore, since each of the drain select lines DSL and the source select lines SSL is formed at a relatively wide interval, the sacrificial layer 125 may be formed along steps resulting from the drain and source select lines DSL and SSL between the drain select lines DSL and between the source select lines SSL.

The sacrificial layer 125 functions to prevent loss of the insulating layer spacers 115 in a subsequent anisotropic etch process. The sacrificial layer 125 may be made of material selected by taking an etch-back process (that is, the subsequent anisotropic etch process) and a wet etch process into consideration. Further, the sacrificial layer 125 may be formed of an insulating layer that has a similar etch rate to the insulating layer spacers 115 in the anisotropic etch process, but has a higher etch rate than the insulating layer spacers 115 in the wet etch process.

Figure 1G:
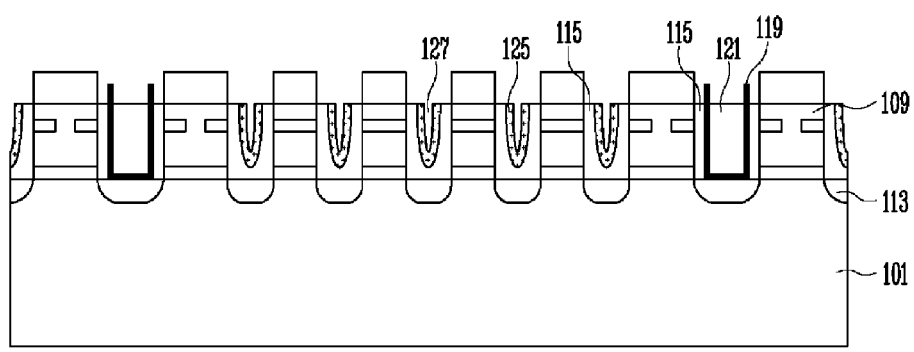

Referring to FIG. 1G, for a subsequent silicidation process, the sacrificial layers 125 (see, for example, FIG. 1F), the insulating layer spacers 115, the first etch-stop layers 119, and the second insulating layers 121 is partially etched using an anisotropic etch process, such as an etch-back process, so that each of the highest silicon layers 109 of the gate lines DSL, SSL, and WL0 to WLn is exposed at a target area. The etch-back process may be performed using the same etch material as the second etch-back process described with reference to FIG. 1C in order to prevent the semiconductor substrate 101 from being exposed.

The reactive by-products are removed because the cleaning process is performed after the etch-back process. Accordingly, a part of the top and sides of each of the highest silicon layers 109 of the gate lines DSL, SSL, and WL0 to WLn is exposed at the target area.

Furthermore, the sacrificial layers 125 (see, for example, FIG. 1F), the insulating layer spacers 115, the first etch-stop layers 119, and the second insulating layers 121 remain at a height lower than the gate lines SSL, WL0 to WLn, and DSL between the gate lines SSL, WL0 to WLn, and DSL, and the voids 127 are opened.

Although the thickness of the insulating layer spacer 115 is thin, the junctions 113 are protected by the sacrificial layer 125 during the etch-back process.

Figure 1H:
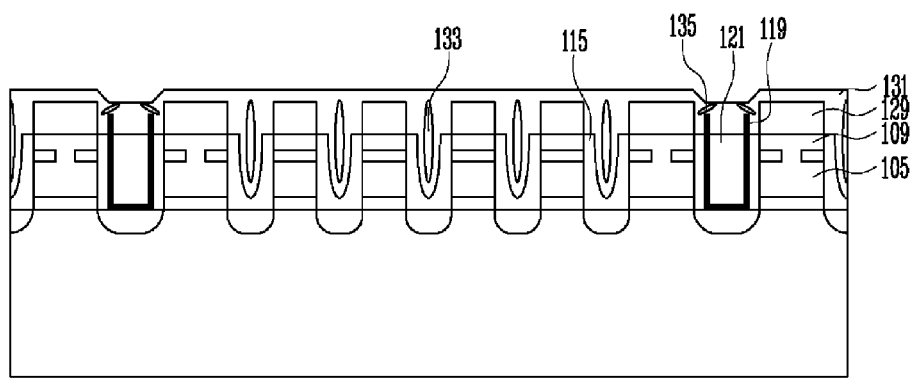

Referring to FIG. 1H, the exposed parts of the silicon layers 109 for control gates are formed into metal silicide layers 129 by performing a silicidation process. For example, a metal layer may be formed on the entire surface of the semiconductor substrate 101 in such a way as to surround the exposed parts of the silicon layers 109 for control gates. The metal layer may be made of cobalt, tungsten, or nickel. Next, the metal silicide layers 129 are formed by a reaction of the silicon of the silicon layers 109, coming into contact with the metal of the metal layer when thermal treatment is performed. If the metal layer is made of tungsten, tungsten silicide layers are formed. If the metal layer is made of cobalt, cobalt silicide layers are formed. If the metal layer is made of nickel, nickel silicide layers are formed. Next, the remaining metal layers not reacting with the silicon layers 109 are removed.

The metal silicide layers 129 are automatically aligned only over the gate lines SSL, WL0 to WLn, and DSL because the metal silicide layers 129 are formed in the state in which only the tops of the silicon layers 109 are exposed by the multi-layered insulating layer 115, 119, and 121. Next, the sacrificial layer 125 (see, for example, FIG. 1F) is removed by a wet etch process.

A third insulating layer 131 for an interlayer dielectric layer is formed on the entire surface of the semiconductor substrate 101 including the metal silicide layers 129. When forming the third insulating layer 131, air gaps 133 may formed again because the openings of the exposed air gaps 127 are clogged by the overhangs of the third insulating layer 131. The third insulating layer 131 may be made of the same material as the second insulating layer 121.

Although the width of each of the gate lines SSL, WL0 to WLn, and DSL is narrowed by the above-described process, resistance of the gate lines SSL, WL0 to WLn, and DSL can be lowered by forming the metal silicide layers 129 having low resistance. Furthermore, the air gaps 133 are formed between the source select line SSL and the word line WL0, between the drain select line DSL and the word line WLn, and between the word lines WL0 to WLn (particularly, between the patterns of the first silicon layers 105 used as the floating gates of the flash memory). Accordingly, interference between the floating gates 105 can be improved because parasitic capacitance between the floating gates 105 is lowered.

Referring to FIG. 1I, a second etch-stop layer 137 and a fourth insulating layer 139 for an interlayer dielectric layer are sequentially stacked over the entire surface of the semiconductor substrate 101 in which the third insulating layer 131 is formed. Contact holes are formed by sequentially etching the fourth insulating layer 139, the second etch-stop layer 137, the third insulating layer 131, the second insulating layers 121, and the first etch-stop layers 119 so that the junction 113 between the source select lines SSL and the junction 113 between the drain select lines DSL are exposed. Contact plugs 141 are formed by filling the respective contact holes with conductive material.

In accordance with an embodiment, although the width of each of the gate lines SSL, WL0 to WLn, and DSL is narrowed, resistance of the gate lines SSL, WL0 to WLn, and DSL can be lowered because the metal silicide layers 129 having low resistance are formed. Furthermore, parasitic capacitance between the word lines WL0 to WLn can be lowered because the air gap 133 is formed between the word lines WL0 to WLn. Accordingly, interference between the word lines WL0 to WLn can be minimized.

However, when etching the first etch-stop layer 119 formed of a nitride layer and the insulating layer spacers 115 formed of an oxide layer using an etch-back process, a part of the first etch-stop layer 119 between the drain select lines DSL and between the source select lines SSL may protrude further than the insulating layer spacer 115 due to a difference in the etch selectivity. Particularly, a part of the first etch-stop layer 119 may protrude higher than the insulating layer spacer 115 owing to a difference in the etch rate between the first etch-stop layer 119 and the insulating layer spacer 115 which are simultaneously exposed and removed by the etch-back process described above with reference to FIG. 1G.

Furthermore, when forming the third insulating layer 131, voids 135 (see, for example, FIG. 1H) may be formed due to the protruding parts of the first etch-stop layers 119. The metal silicide layers 129 of the drain and source select lines DSL and SSL may be exposed when forming the contact holes, and the metal silicide layers 129 of the select lines DSL and SSL and the contact plugs 141 may be coupled due to the voids 135 formed in the third insulating layer 131.

Another embodiment of this disclosure for addressing that the voids 135 are formed in the third insulating layer 131 is described below.

FIGS. 2A to 2H are cross-sectional views illustrating a method of manufacturing a semiconductor device according to another embodiment of this disclosure.

Figure 2A:
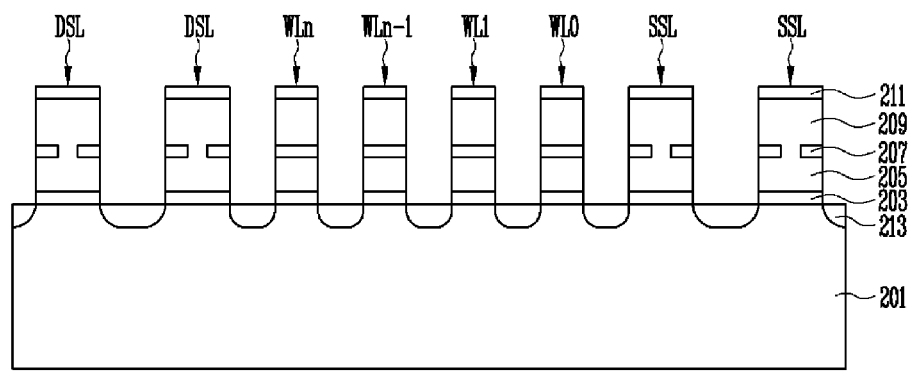
FIGS. 2A to 2H are cross-sectional views illustrating a method of manufacturing a semiconductor device according to another embodiment of this disclosure.

Referring to FIG. 2A, gate lines SSL, WL0 to WLn, and DSL having silicon layers 209 as the highest layers are formed over a semiconductor substrate 201. Junctions 213 are formed in the semiconductor substrate 201 between the gate lines SSL, WL0 to WLn, and DSL.

Gate lines of NAND flash memory may include first gate lines and second gate lines. The first gate lines are the word lines WL0 to WLn. The second gate lines are the drain select lines DSL or the source select lines SSL. Each of the gate lines may have a stack structure including a tunnel dielectric layer 203, a silicon layer 205 for floating gates, a dielectric layer 207, and the silicon layer 209 for control gates. A hard mask layer 211 is formed over the gate lines SSL, WL0 to WLn, and DSL. The hard mask layer 211 may be formed of an oxide layer. The gate lines SSL, WL0 to WLn, and DSL and the junctions 213 may be formed using the same method as that described with reference to FIG. 1A.

Figure 2B:
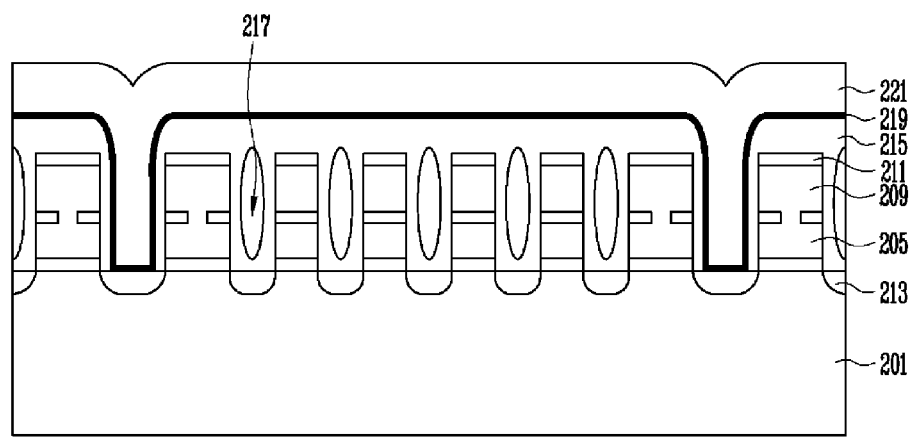

Referring to FIG. 2B, a multi-layered insulating layer 215, 219, and 221 may be formed on the entire structure including the gate lines SSL, WL0 to WLn, and DSL. This is described in detail below.

A first insulating layer for spacers is formed on the entire surface of the semiconductor substrate 201 including the gate lines SSL, WL0 to WLn, and DSL. The first insulating layer may have an overhang structure so that air gaps 217 are formed between the source select line SSL and the word line WL0, between the drain select line DSL and the word line WLn, and between each of the word lines WL0 to WLn. The first insulating layer may be formed of an oxide layer. For example, the first insulating layer may be an undoped silicate glass (USG) layer formed by using a disilane-high temperature oxide (DS-HTO) method or a plasma-enhanced chemical vapor deposition (PE-CVD) method.

An interval between the source select line SSL and the word line WL0, an interval between the drain select line DSL and the word line WLn, and an interval between the word lines WL0 to WLn is smaller than an interval between the drain select lines DSL or the source select lines SSL. Furthermore, in the process of forming the first insulating layer, overhangs are formed at the top corners of the gate lines DSL, SSL, and WL0 to WLn. Accordingly, the first insulating layer is not fully filled between the source select line SSL and the word line WL0, between the drain select line DSL and the word line WLn, and between the word lines WL0 to WLn, but the air gaps 217 are formed therebetween. Furthermore, since each of the drain select lines DSL and the source select lines SSL is formed at a relatively wide interval, the first insulating layer is formed along steps resulting from the drain and source select lines DSL and SSL between the drain select lines DSL and between the source select lines SSL.

Next, the insulating layer spacer 215 is formed by performing an anisotropic etch-back process. The junctions 213 between the drain select lines DSL and between the source select lines SSL are exposed through the insulating layer spacer 215, and the insulating layer spacer 215 remains on the sidewalls of the drain and source select lines DSL and SSL between the drain select lines DSL and between the source select lines SSL. Furthermore, the insulating layer spacer 215 forms the air gaps 217 between the source select line SSL and the word line WL0, between the drain select line DSL and the word line WLn, and between the word lines WL0 to WLn. The insulating layer spacer 215 remains so that the insulating layer spacer 215 covers the junctions 213 between the source select line SSL and the word line WL0, between the drain select line DSL and the word line WLn and between the word lines WL0 to WLn. And, the insulating layer spacer 215 covers the drain and source select lines DSL and SSL and the word lines WL0 to WLn.

Also, 5-valance impurities may be further implanted into the junctions 213 exposed between the drain select lines DSL and between the source select lines SSL by an ion implantation process using the insulating layer spacer 215 as an ion implantation mask. Thus, each of the junctions 213 under the insulating layer spacer 215 remaining on the sidewalls of the drain and source select lines DSL and SSL has a lower concentration than the junction 213 exposed between the insulating layer spacers 215. Accordingly, the junction 213 between the drain select lines DSL or between the source select lines SSL has a lightly doped drain (LDD) structure.

Next, a first etch-stop layer 219 is formed on a surface of the insulating layer spacer 215 and the surfaces of the semiconductor substrate 201 between the drain select lines DSL and between the source select lines SSL exposed by the insulating layer spacer 215. A second insulating layer 221 for an interlayer dielectric layer is formed on the first etch-stop layer 219. For example, the first etch-stop layer 219 may be formed of a nitride layer. The first etch-stop layer 219 is formed on the entire surface of the semiconductor substrate 201 including the sidewalls of the drain and source select lines DSL and SSL to a thickness enough to maintain the steps resulting from the insulating layer spacer 215. For another example, the second insulating layer 221 may be formed of an oxide layer. The second insulating layer 221 is formed on the entire surface of the semiconductor substrate 201 in which the first etch-stop layer 219 is formed to a thickness enough to fill the space between the drain select lines DSL and the space between the source select lines SSL.

Figure 2C:
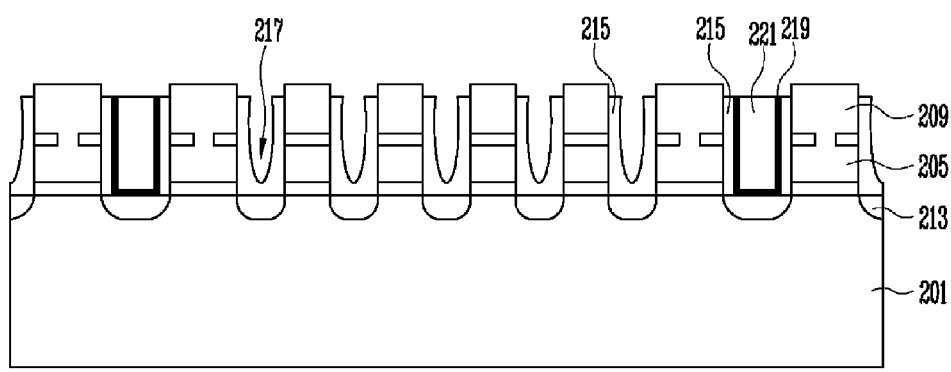

Referring to FIG. 2C, the second insulating layer 221, the first etch-stop layer 219, and the insulating layer spacer 215 are partially removed so that the air gaps 217 are opened. Accordingly, the second insulating layer 221 and the first etch-stop layer 219 remain only between the drain select lines DSL and between the source select lines SSL, and the insulating layer spacer 215 remains only between the gate lines SSL, WL0 to WLn, and DSL. In this case, the hard mask layer 211 may be removed.

A process of partially removing the multi-layered insulating layer (221, 219, and 215) so that the highest silicon layers 209 of the gate lines SSL, WL0 to WLn, and DSL are exposed may be performed as follows.

The second insulating layer 221 is polished by a polishing process (for example, a chemical mechanical polishing (CMP) process) stopped when the first etch-stop layer 219 is exposed. The exposed multi-layered insulating layer (221, 219, and 215) are partially removed by a first anisotropic etch-back process. In the first etch-back process, the etch thickness is controlled so that the insulating layer spacer 215 remains over the air gaps 217 to a specific thickness and thus the air gaps 217 are not exposed. Next, the multi-layered insulating layer (221, 219, and 215) and the hard mask layer 211 are etched by a second etch-back process so that the air gaps 217 are exposed. The second etch-back process may be performed using material capable of generating reactive by-products as described above with reference to FIG. 1C so that the insulating layer spacers 215 under the air gaps 217 remain and thus damage to the semiconductor substrate 201 is reduced. The reactive by-products are removed by a cleaning process subsequent to the second etch-back process. Accordingly, not only are the air gaps 217 opened, but a part of the sidewalls of the highest silicon layers 209 of the gate lines SSL, WL0 to WLn, and DSL can be uniformly exposed.

Figure 2D:
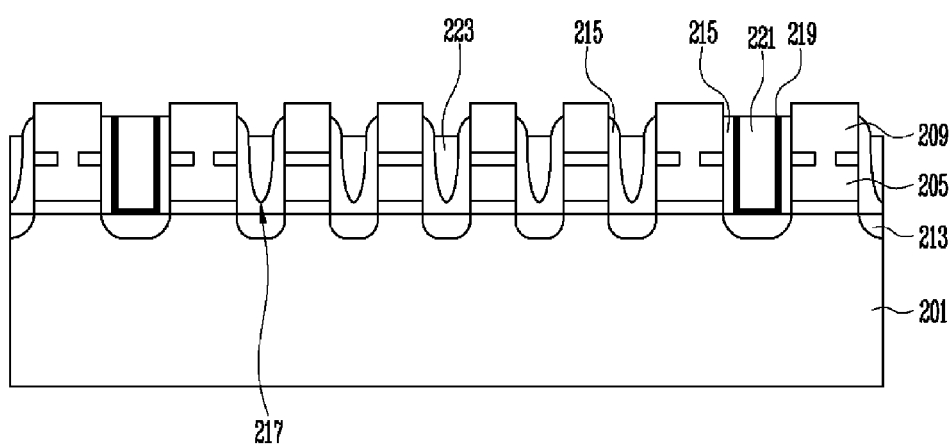

Referring to FIG. 2D, a gap-fill layer 223 is formed on the entire surface of the semiconductor substrate 201 including the gate lines SSL, WL0 to WLn, and DSL so that the spaces between the gate lines SSL, WL0 to WLn, and DSL are filled. The gap-fill layers 223 may be formed of an insulating layer, a spin-on carbon (SOC) layer, or photoresist which has good fluidity. Since the gap-fill layer 223 is made of material having good fluidity, the air gaps 217 opened between the gate lines SSL, WL0 to WLn, and DSL are fully filled by the gap-fill layer 223.

The gap-fill layer 223 is etched by an anisotropic etch process, such as an etch-back process, so that the openings of the air gaps 217 are exposed. Next, the insulating layer spacers 215 exposed by the gap-fill layers 223 are etched. Accordingly, the width of each of the openings of the air gaps 217 is increased.

Figure 2E:
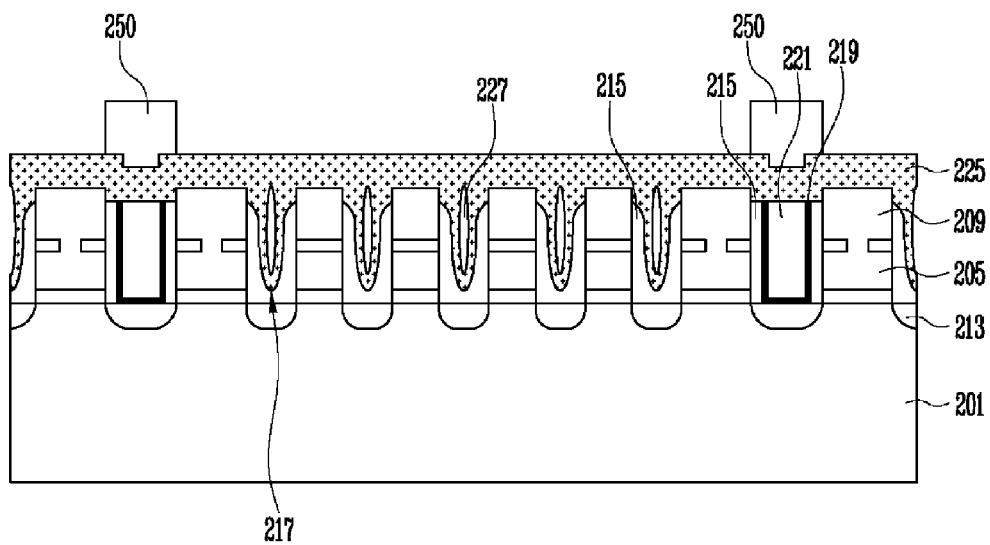

Referring to FIG. 2E, after removing the gap-fill layers 223, a sacrificial layer 225 is formed on the entire surface of the semiconductor substrate 201 including the air gaps 217 having the widened openings. Since the openings of the air gaps 217 have been increased by the previous process, the sacrificial layer 225 may be formed on the insulating layer spacers 215 at the bottoms of the air gaps 217. An interval between the air gaps 217 is smaller than the interval between the drain select lines DSL or between the source select lines SSL, and overhangs are formed at the top corners of the gate lines DSL, SSL, and WL0 to WLn in a process of forming the sacrificial layer 225. Thus, the air gaps 217 are not fully filled by the sacrificial layer 225. Accordingly, the sacrificial layer 225 is not fully filled between the source select line SSL and the word line WL0, between the drain select line DSL and the word line WLn and between the word lines WL0 to WLn, but voids 227 are formed therebetween.

Furthermore, since each of the drain select lines DSL and the source select lines SSL is formed at a relatively wide interval, the sacrificial layer 225 is formed along steps resulting from the select lines DSL and SSL between the drain select lines DSL and between the source select lines SSL.

The sacrificial layer 225 functions to prevent loss of the insulating layer spacers 215 on bottoms of the air gaps 217 during a subsequent anisotropic etch process. As a result, damage to the semiconductor substrate 201 occurring when the insulating layer spacers 215 on bottoms of the air gaps 217 can be prevented. The sacrificial layer 225 may be made of material selected by taking an etch-back process (that is, the subsequent anisotropic etch process) and a wet etch process into account. The sacrificial layer 225 is may be an insulating layer that has a similar etch rate to the insulating layer spacers 215 in the anisotropic etch process, but has a higher etch rate than the insulating layer spacers 215 in the wet etch process. For example, the sacrificial layer 225 may be made of dichlorosilane-high temperature oxide (DCS-HTO), poly silazane (PSZ), ultra low temperature oxide (ULTO), spin-on carbon (SOC), or phosphosilicate glass (PSG).

Next, mask pattern 250 is formed to block or cover the sacrificial layer 225 formed on the multi-layered insulating layer (221, 219, and 215) between the drain select lines DSL and between the source select lines SSL, respectively. The mask patterns 250 are formed to prevent the multi-layered insulating layer (221, 219, and 215) between the drain select lines DSL and between the source select lines SSL from being etched in an etch-back process (that is, the subsequent anisotropic etch process). The mask patterns 250 may be photoresist patterns formed by a photolithography process.

Figure 2F:
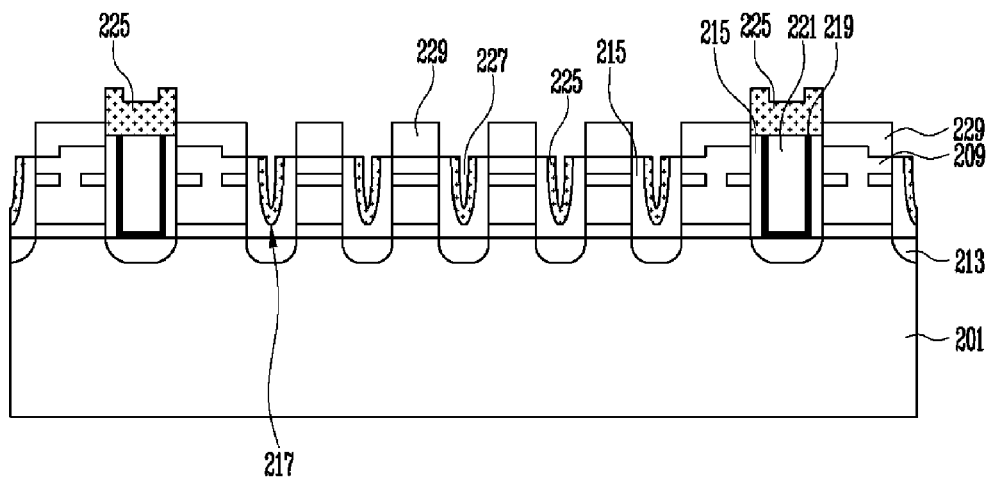

Referring to FIG. 2F, the sacrificial layer 225, the insulating layer spacers 215, the first etch-stop layers 219, and the second insulating layers 221 which are exposed when the mask patterns 250 are partially etched by an anisotropic etch process, such as an etch-back process. Accordingly, the highest silicon layers 209 of the gate lines DSL, SSL, and WL0 to WLn are exposed at a target area for a subsequent silicidation process. The etch-back process may be performed using the same etch material as the second etch-back described above with reference to FIG. 1C in order to prevent the semiconductor substrate 201 from being exposed. The reactive by-products are removed because a cleaning process is performed after the etch-back process. Accordingly, a part of each of the tops and sidewalls of the highest silicon layers 209 of the gate lines DSL, SSL, and WL0 to WLn is exposed at the target area.

Furthermore, the sacrificial layers 225 and the insulating layer spacers 215 between the source select line SSL and the word line WL0, between the drain select line DSL and the word line WLn and between the word lines WL0 to WLn remain higher than the gate lines SSL, WL0 to WLn, and DSL, and the voids 227 are opened. Furthermore, the sacrificial layers 225 and the multi-layered insulating layer (221, 219, and 215) between the drain select lines DSL and between the source select lines SSL remain high because they are covered by the mask pattern 250 during the etch-back process. In addition, the sacrificial layers 225 and the multi-layered insulating layer (221, 219, and 215) remain lower between the source select line SSL and the word line WL0, and between the drain select line DSL and the word line WLn, than between the drain select lines DSL and between the source select lines SSL.

In the etch-back process performed so that the highest silicon layers 209 of the gate lines DSL, SSL, and WL0 to WLn are exposed at the target area as described above, the first etch-stop layer 219 formed of the nitride layer (unlike the sacrificial layer 225), the insulating layer spacer 215, and the second insulating layer 221 which are formed of the oxide layer are not exposed. Accordingly, although the etch-back process is performed using etch material, the first etch-stop layers 219 can be prevented from remaining higher than the insulating layer spacers 215 and the second insulating layers 221 because of a difference in the etch rate which may occur when the exposed oxide layer and the exposed nitride layer are etched at the same time. That is, since the insulating layer spacer 215 between the first etch-stop layer 219 and each of the sidewalls of the drain and source select lines DSL and SSL is not removed by the etch-back process, an empty space is not formed between the first etch-stop layer 219 and each of the sidewalls of the drain and source select lines DSL and SSL.

Although the thickness of the insulating layer spacer 215 remaining over the sidewall of each of the drain and source select lines DSL and SSL and the word lines WL0 to WLn, and the thickness of the insulating layer spacer 215 remaining over the junctions 213 between the source select line SSL and the word line WL0, between the drain select line DSL and the word line WLn and between the word lines WL0 to WLn are thin, the junctions 213, the source and drain select lines SSL and DSL and the word lines WL0 to WLn are protected by the sacrificial layer 225 during the etch-back process.

The mask pattern 250 is removed. The exposed parts of the silicon layers 209 for control gates are formed into metal silicide layers 229 by performing a silicidation process. More specifically, a metal layer is formed on the entire surface of the semiconductor substrate 201, such that the exposed parts of the silicon layers 209 for control gates are covered. For example, the metal layer may be made of cobalt, tungsten, or nickel. Next, the metal silicide layers 229 are formed by a reaction of the silicon of the silicon layers 209, coming into contact with the metal of the metal layer when thermal treatment is performed. If the metal layer is made of tungsten, tungsten silicide layers are formed. If the metal layer is made of cobalt, cobalt silicide layers are formed. If the metal layer is made of nickel, nickel silicide layers are formed. Next, the remaining metal layers not reacting with the silicon layers 209 are removed.

As described above, the metal silicide layers 229 are formed in the state in which only the tops of the silicon layers 209 are exposed by the sacrificial layers 225, the insulating layer spacers 215, the first etch-stop layers 219, and the second insulating layers 221. Accordingly, the metal silicide layers 229 are automatically aligned over the gate lines SSL, WL0 to WLn, and DSL.

Figure 2G:
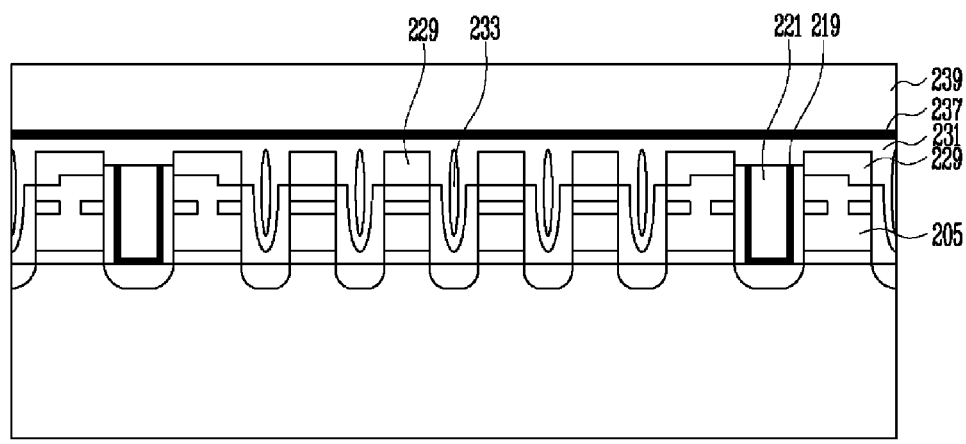

Referring to FIG. 2G, the air gaps 227 (see, for example, FIG. 2F) are exposed by removing the sacrificial layers 225 (see, for example, FIG. 2F) using a wet etch process. A third insulating layer 231 for an interlayer dielectric layer, a second etch-stop layer 237, and a fourth insulating layer 239 for an interlayer dielectric layer are sequentially formed over the entire surface of the semiconductor substrate 201 including the metal silicide layers 229. The third and the fourth insulating layers 231 and 239 may be formed of the same oxide layer as the second insulating layer 221. The second etch-stop layer 237 may be formed of a nitride layer.

Here, air gaps 233 may be formed again because the exposed openings of the air gaps 227 (see, for example, FIG. 2F), are clogged by the overhangs of the third insulating layer 231 when forming the third insulating layer 231.

Although the width of each of the gate lines SSL, WL0 to WLn, and DSL is narrowed by the above-described process, resistance of the gate lines SSL, WL0 to WLn, and DSL can be lowered because the metal silicide layers 229 having low resistance are formed. Furthermore, since the air gaps 233 are formed between the source select line SSL and the word line WL0, between the drain select line DSL and the word line WLn and between the word lines WL0 to WLn (particularly, between the floating gates 205 of the flash memory device), interference between the floating gates 205 can be improved because parasitic capacitance between the floating gates 205 is lowered.

Figure 2H:
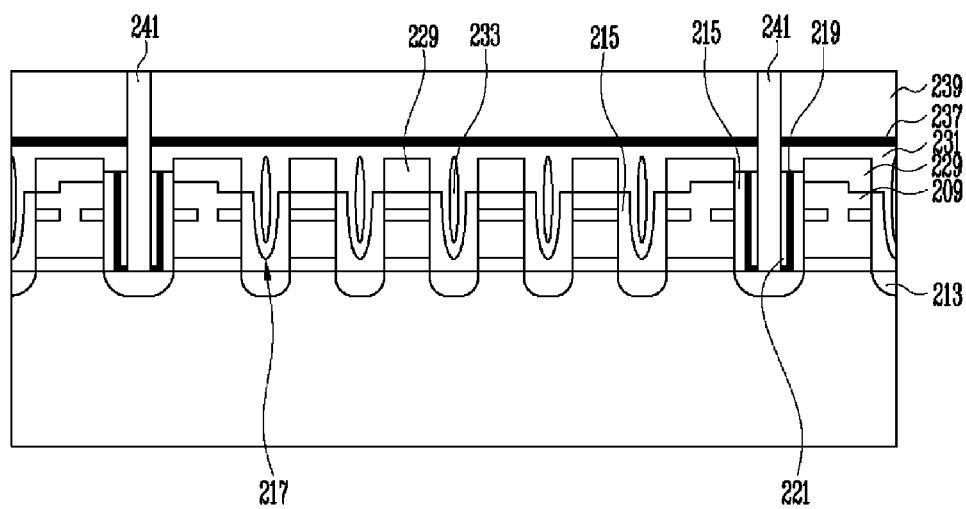

Referring to FIG. 2H, contact holes are formed by sequentially etching the fourth insulating layer 239, the second etch-stop layer 237, the third insulating layer 231, the second insulating layers 221, and the first etch-stop layers 219 so that the junctions 213 between the drain select lines DSL and between the source select lines SSL are exposed. Contact plugs 241 are formed by filling the contact holes with conductive material.

In accordance with another embodiment, although the width of each of the gate lines SSL, WL0 to WLn, and DSL is narrowed, resistance of the gate lines SSL, WL0 to WLn, and DSL can be lowered because the metal silicide layers 219 having low resistance are formed. Furthermore, since the air gaps 233 are formed between the word lines WL0 to WLn, parasitic capacitance between the word lines WL0 to WLn can be lowered and thus interference between the word lines WL0 to WLn can be improved.

As compared with the previous embodiment, in the etch-back process performed so that the silicon layers 209 are exposed, the etch-stop layers 221 and the insulating layer spacers 215 between the drain select lines DSL and between the source select lines SSL are not etched because they are covered by the mask pattern 250 (see, for example, FIG. 2E). Accordingly, the etch-stop layers 221 can be prevented from protruding higher than the insulating layers 215 and 221 owing to a difference in the etch selectivity between the insulating layer spacer 215 and the etch-stop layer 221. Accordingly, voids can be prevented from being formed when forming the third insulating layer 231. Consequently, the metal silicide layers 229 of the select lines DSL and SSL can be prevented from being exposed owing to the voids when forming the contact holes. Furthermore, since the metal silicide layers 229 of the select lines DSL and SSL can be prevented from being exposed when forming the contact holes, the contact plug 241 can be prevented from being coupled to the gate lines SSL, WL0 to WLn, and DSL.

Furthermore, the etch-stop layers 221 can be prevented from protruding higher than the insulating layer spacers 215 by a simple method of covering the regions between the drain select lines DSL and the source select lines SSL using mask pattern 250 (see, for example, FIG. 2E) without using new material for the etch-back etch processes.

The example embodiments of this disclosure have been described on the basis of the silicidation process with reference to FIGS. 2A to 2H, but are not limited thereto. For example, embodiments of this disclosure may also be applied to an example in which an etch selectivity exists between materials forming multi-layered insulating layer in a process of forming the multi-layered insulating layer over patterns formed at different intervals and then etching the multi-layered insulating layer in order to expose the patterns.

As described above, in accordance with this disclosure, resistance of the gate lines can be improved by forming a part of the gate lines using metal silicide layers.

Furthermore, a mask pattern is formed such that heights of the insulating layer and the etch-stop layer between the gate lines (for example, the source select lines or the drain select lines) formed at a relatively wide interval can be maintained while etching the insulating layer between the gate lines (for example, between the word lines, between the word line and the source select line and between the word line and the drain select line) formed at relatively narrow intervals using the etch-back process. Next, the etch-back process is performed. Accordingly, the etch-stop layers can be prevented from protruding higher than the insulating layers because the etch-stop layer and the insulating layer between the gate lines at a wide interval are fundamentally prevented from being etched at different rates under the influence of the etch-back process. Consequently, voids can be fundamentally prevented from occurring due to the protruding parts of the etch-stop layers.

What is claimed is:

1. A method of manufacturing a semiconductor device, comprising:
    forming first gate lines and second gate lines over a semiconductor substrate, wherein the second gate lines are arranged at wider intervals than each of the first gate lines;
    forming a multi-layered insulating layer over an entire surface of the semiconductor substrate including the first and the second gate lines;
    etching the multi-layered insulating layer so that a part of the multi-layered insulating layer remains between the first gate lines, and between the first and the second gate lines;
    forming a mask pattern on the remaining multi-layered insulating layer, wherein the mask pattern covers the multi-layered insulating layer between the second gate lines; and
    etching the multi-layered insulating layer not covered by the mask pattern to expose the first gate lines and the second gate lines, wherein the multi-layered insulating layer remains lower between the first gate lines than between the second gate lines.

2. The method of claim 1, wherein a highest layer of each of the first and the second gate lines is formed of a silicon layer.

3. The method of claim 2, further comprising:
    removing the mask pattern, after etching the multi-layered insulating layer not covered by the mask pattern; and
    performing a silicidation process of forming metal silicide layer by reacting the exposed parts of the silicon layer with metal.

4. The method of claim 3, further comprising forming a third insulating layer, covering an entire surface of the semiconductor substrate including the metal silicide layer, so that an air gap is formed between the first gate lines, after performing the silicidation process.

5. The method of claim 1, wherein forming the multi-layered insulating layer further comprises:
    forming a first insulating layer on an entire surface of the semiconductor substrate including the first and the second gate lines, so that an air gap is formed between the first gate lines;
    etching the first insulating layer so that the semiconductor substrate between the second gate lines is exposed;
    forming an etch-stop layer on a surface of the semiconductor substrate between the second gate lines and on a surface of the first insulating layer, not covered by the etched first insulating layer; and
    forming a second insulating layer on the etch-stop layer, wherein the second insulation layer is formed to fill a space between the second gate lines.

6. The method of claim 5, wherein:
    each of the first insulating layer and the second insulating layer is an oxide layer, and
    the etch-stop layer is a nitride layer.

7. The method of claim 5, wherein etching the multi-layered insulating layer so that a part of the multi-layered insulating layer remains between the first gate lines and the first and the second gate lines comprises:
    polishing the second insulating layer so that the polishing is stopped when the etch-stop layer is exposed; and
    etching the second insulating layer, the etch-stop layer, and the first insulating layer so that the first insulating layer remains on bottom of the respective air gaps, but the air gaps are exposed.

8. The method of claim 7, further comprising:
    filling the air gaps with a gap-fill layer after the air gaps are exposed;
    etching the gap-fill layer by an etch-back process so that openings of the air gaps are exposed;
    widening the openings of the air gaps by etching the first insulating layer exposed by the gap-fill layer;
    removing the gap-fill layer so that the air gaps are exposed; and
    forming a sacrificial layer covering an entire surface of the semiconductor substrate in which the air gaps are exposed so that voids are formed within the air gaps.

9. The method of claim 8, further comprising forming the mask pattern after forming the sacrificial layer.

10. The method of claim 8, further comprising removing the sacrificial layer so that the air gaps are exposed.

11. A method of manufacturing a semiconductor device, comprising:
    forming stack structure, including a silicon layer, over a semiconductor substrate;
    forming word lines and select lines, arranged at wider intervals than the word lines, by patterning the stack structure;
    forming a first insulating layer, covering the word lines and the select lines, so that air gaps are formed between the word lines and between the word line and the select line, and the semiconductor substrate between the select lines is exposed;
    sequentially forming an etch-stop layer and a second insulating layer over an entire surface of the semiconductor substrate including the first insulating layer;
    removing a part of each of the second insulating layer, the etch-stop layer, and the first insulating layer so that the air gaps are exposed;
    forming a sacrificial layer on an entire surface of the semiconductor substrate, including the air gaps, so that voids are formed within the air gaps;
    covering the sacrificial layer between the select lines using a mask pattern;
    etching a part of each of the sacrificial layer and the first insulating layer not covered by the mask pattern so that the silicon layers are exposed, wherein the sacrificial layer and the first insulating layer remain lower between the word lines than between the select lines;
    removing the mask pattern; and forming the exposed parts of the silicon layer into metal silicide layer by a silicidation process.

12. The method of claim 11, wherein:
each of the first insulating layer and the second insulating layer is an oxide layer, and
the etch-stop layer is a nitride layer.

13. The method of claim 11, further comprising:
filling the air gaps with a gap-fill layer so that openings of the air gaps are exposed, after the air gaps are exposed;
widening the openings of the air gaps by etching the first insulating layer not covered by the gap-fill layer; and
removing the gap-fill layer so that the air gaps are exposed.

14. The method of claim 11, further comprising:
removing the sacrificial layer so that the air gaps are exposed, after forming the metal silicide layer; and
forming a third insulating layer covering an entire surface of the semiconductor substrate including the metal silicide layer so that air gaps are formed again between the first gate lines.

* * * * *